United States Patent
Visweswariah

(10) Patent No.: US 7,428,716 B2
(45) Date of Patent: *Sep. 23, 2008

(54) SYSTEM AND METHOD FOR STATISTICAL TIMING ANALYSIS OF DIGITAL CIRCUITS

(75) Inventor: Chandramouli Visweswariah, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 1046 days.

This patent is subject to a terminal disclaimer.

(21) Appl. No.: 10/666,353

(22) Filed: Sep. 19, 2003

(65) Prior Publication Data

US 2005/0065765 A1    Mar. 24, 2005

(51) Int. Cl.
*G06F 17/50* (2006.01)
(52) U.S. Cl. .................... 716/6; 703/2; 703/16
(58) Field of Classification Search ............ 716/6; 703/2, 16
See application file for complete search history.

(56) References Cited

U.S. PATENT DOCUMENTS

| | | | | |
|---|---|---|---|---|
| 5,181,226 | A * | 1/1993 | Cantwell | 375/130 |
| 5,383,167 | A * | 1/1995 | Weil | 703/19 |
| 7,080,290 | B2 * | 7/2006 | James et al. | 714/47 |
| 7,111,260 | B2 * | 9/2006 | Visweswariah | 716/6 |
| 7,149,674 | B1 * | 12/2006 | Sirichotiyakul et al. | 703/15 |
| 2005/0066296 | A1 * | 3/2005 | Visweswariah | 716/6 |
| 2006/0277513 | A1 * | 12/2006 | Visweswariah | 716/6 |

FOREIGN PATENT DOCUMENTS

| | | |
|---|---|---|
| JP | 04-274567 | 9/1992 |
| JP | 2002-279012 | 9/2002 |

OTHER PUBLICATIONS

Statistical Timing of Parametric Yield Prediction of Digital Integrated Circuits, by J.A.G. Jess, K. Kalafala, S.R. Naidu, R.H.J.M. Otten, C. Visweswariah, pp. 932-937, Design Automation Conference 2003.

(Continued)

*Primary Examiner*—Phallaka Kik
(74) *Attorney, Agent, or Firm*—Brian Verminski; Hoffman Warnick LLC

(57) ABSTRACT

The present invention is a system and method for statistical or probabilistic static timing analysis of digital circuits, taking into account statistical delay variations. The delay of each gate or wire is assumed to consist of a nominal portion, a correlated random portion that is parameterized by each of the sources of variation and an independent random portion. Arrival times and required arrival times are propagated as parameterized random variables while taking correlations into account. Both early mode and late mode timing are included; both combinational and sequential circuits are handled; static CMOS as well as dynamic logic families are accommodated. The timing analysis complexity is linear in the size of the graph and the number of sources of variation. The result is a timing report in which all timing quantities such as arrival times and slacks are reported as probability distributions in a parameterized form.

21 Claims, 5 Drawing Sheets

OTHER PUBLICATIONS

Fast Statistical Timing Analysis By Probabilistic Event Propagation, by Jing-Jia Liou, Kwang-Ting Cheng, Sandip Kundu, and Angela Krstic, pp. 661-666, Design Automation Conference 2001.

Explicit Computation of Performance as a Function of Process Variation by Lou Scheffer, TAU '02, pp. 1-8, 2002.

Timing Yield Estimation from Static Timing Analysis, by Anne Gattiker, Sani Nassif, Rashmi Dinakar, and Chris Long, pp. 437-442, International Symposium on Quality Electronic Design, 2001.

J. A. G. Jess and C. Visweswariah, "System and method for statistical modeling and statistical analysis of integrated circuits," U.S. Appl. No. 10/184,329, filed with the U.S. Patent Office on Jun. 27, 2002.

Jess, J.A.G. et al. "Statistical Timing for Parametric Yield Prediction of Digital Integrated Circuits", Proc. Design Automation Conference, ACM, p. 932-937, Jun. 2-6, 2003.

Nishimoto Shuji et al., "A Statistical Static Timing Analyzer for CMOS Combinatorial Circuits Considering Correlations Between Delays", vol. 100, No. 475, pp. 11-16, Nov. 23, 2000, English translation of abstract only.

* cited by examiner

SYSTEM AND METHOD FOR STATISTICAL TIMING ANALYSIS OF DIGITAL CIRCUITS

FIELD OF THE INVENTION

This invention relates to design automation of digital integrated circuits. More specifically, it relates to static timing analysis of digital circuits in the presence of delay variations. Yet more specifically, the invention relates to propagating arrival and required arrival times of a digital circuit in a probabilistic or statistical fashion, while considering and preserving correlations between the delays of various circuit elements.

RELATED APPLICATIONS

C. Visweswariah, "System and Method for Probabilistic Criticality Prediction of Digital Circuits," U.S. Pat. No. 7,086,023, issued Aug. 1, 2006.

C. Visweswariah, "System and Method for Incremental Statistical Timing Analysis of Digital Circuits," U.S. Pat. No. 7,111,260, issued Sep. 19, 2006.

The descriptions set forth in these co-pending applications are hereby incorporated into the present application by reference in their entirety.

BACKGROUND OF THE INVENTION

With each succeeding generation of integrated circuit technology, variability is proportionately increasing. The sources of such variability include manufacturing variations, device fatigue, environmental variations and phase-locked loop (PLL) variations. In the case of manufacturing variations, the front-end-of-the-line (FEOL) which are the layers that define the active transistors show variation in the transistor's electrical characteristics. Physical quantities such as the length of the gate, depth of the semiconductor junction or thickness of the oxide cannot be perfectly controlled during manufacturing and hence show variations, which lead to variations in the behavior of the transistors. As the physical dimensions get smaller in modern technologies, variability is proportionately increasing. In addition, the back-end-of-the-line (BEOL), which consists of the metal interconnect layers, also exhibits variability. For example, the thickness, width and inter-layer dielectric thickness of each metal layer are sources of variability. These in turn cause the wires to change their delay, and in fact these sources of variability can change the delay of gates which are driving them and gates which are driven by them.

The second main type of variations is due to device fatigue effects such as hot electron and negative bias temperature instability (NBTI). After a long period of use in the field, transistor characteristics change due to these physical phenomena, leading to changes in the delay of circuit components.

The third main type of variations is due to environmental effects such as temperature and power supply voltage.

The fourth main type of variations is PLL variations which can include PLL jitter and duty-cycle variability.

It is to be noted that in addition to the above, there are other sources of variation such as model-to-hardware miscorrelation, silicon-on-insulator (SOI) history effects and coupling noise. These other types of variation can also be considered during statistical timing analysis of digital integrated circuits.

The variation of delays shown by gates and wires in an integrated circuit can be classified in many different ways. The variation may be from batch-to-batch during the manufacturing, wafer-to-wafer, chip-to-chip or within a single chip. Lens aberration effects during photolithography, for example, can cause variation of the effective length of transistors across a reticle field. There can be temperature and power supply voltage variations across a chip. The variations can also be classified by the time scales during which variability develops. For instance, fatigue effects cause variability over a period of years, whereas across the chip temperature or power supply gradients can develop over seconds or milliseconds, and coupling noise variations can occur in nanoseconds or picoseconds. Whichever way they are classified, it is abundantly clear that these sources of variation are making integrated circuit analysis and design more difficult and must be accurately accounted for during timing analysis.

The traditional timing methodology to handle such variability is to conduct multiple static timing analyses at different "cases" or "corners" to determine the spread of performance of the circuit under these variations. Corners may include, for example, "best case," "nominal" and "worst case." Unfortunately, the traditional methodology is breaking down because the number of independent and significant sources of variation is numerous, and too many timing runs would be required. One way to combat this is to worst-case or guard-band against some sources of variation, but this causes pessimism in the performance prediction. Another way to combat the explosion of timing runs required is to skip the analysis at certain corners, but this is risky since the performance of the circuit may be unacceptable at the skipped corners and this may be manifested by chips failing on the tester or in the field. Because of these effects, traditional timing methodologies are rapidly becoming burdensome, as well as risky and pessimistic at the same time.

A solution to the problems faced by traditional timing methodologies is statistical or probabilistic timing analysis. In such an analysis, timing quantities such as delays, arrival times and slacks are not treated as single numbers, but rather as probability distributions. Thus the full probability distribution of the performance of the circuit under the influence of variations is predicted by a single timing run. The problems of unnecessary risk, excessive timing runs and pessimism are all potentially avoided. Four examples of such statistical timing methods in the prior art include Liou et al [J-J. Liou, K-T. Cheng, S. Kundu and A. Krstic, "Fast statistical timing analysis by probabilistic event propagation," Proc. Design Automation Conference, June 2001, Las Vegas, Nev., pages 661-666], Scheffer [L. Scheffer, "Explicit computation of performance as a function of process variation," Proc. ACM/IEEE workshop on timing issues in the specification and synthesis of digital systems, December 2002, Monterey, Calif., pages 1-8], Gattiker et al [A. Gattiker, S. Nassif, R. Dinakar and C. Long, "Timing yield estimation from static timing analysis," Proc. IEEE International Symposium on Quality Electronic Design (ISQED), 2001, pages 437-442] and Jess et al [J. A. G. Jess, K. Kalafala, S. R. Naidu, R. H. J. M. Otten and C. Visweswariah, "Statistical timing for parametric yield prediction of digital integrated circuits," Proc. Design Automation Conference, June 2003, Anaheim, Calif., pages 932-937]. The references cited above are herein incorporated by reference in their entirety.

PROBLEMS WITH THE PRIOR ART

There are several reasons why prior-art methods are not suitable in practice. The main shortcoming of prior-art methods is their failure to correctly account for correlations. The delays of gates and wires on an integrated circuit exhibit strong correlation. Consider a simple example to demonstrate the importance of correlations. A chip that has 50,000 latches has 50,000 setup timing tests and 50,000 hold timing tests. Assume that the probability of each of these tests being successfully met is 99.99%. If the 100,000 probabilities are perfectly correlated, then the overall probability of the chip working correctly is 99.99%. That is, if one test passes, they will all pass. However, if the probabilities are independent, then the probability of making a working chip is 0.9999 raised to the $100,000^{th}$ power, which is a paltry yield of 0.005%!

There are many sources of delay correlation, and some examples are described below. Two paths may share some of the same gates; in this case, the delays of the two paths are correlated. If a particular chip has stronger P-type transistors due to some manufacturing variations, chances are that every single P-type transistor on that chip will be stronger. If the $3^{rd}$ level of metal is a little thicker, it is likely to be thicker across the entire chip. A launching path (path that gets the data signal to a latch) and a capturing path (path that gets the corresponding clock signal to the same latch) may exhibit some commonality and therefore have correlated delays. The commonality could include sharing some gates along the path, sharing metal layers, sharing a power supply voltage island, sharing gates of the same type, etc. Delays of gates may also be correlated because of their physical position on the surface of a chip. For example, two gates that are close to each other are unlikely to see significant relative channel length variation and their delays are therefore likely to be tightly correlated.

All of these sources of variation must be accurately taken into account, or else the results will not be meaningful. In Liou et al, the delay of each individual gate is considered to be completely independent of any other gate, rendering the analysis unusable in practice. In Gattiker et al, gate delay correlations are considered. Critical paths are enumerated, but when the effects of these paths are combined, the delay of each path is considered to be independent of any other, thus ignoring several important sources of correlation.

Among the prior art methods, one that takes into account correlation is Jess et al. This method is a path-based method. The delay or slack of each path is collected and represented as a first-order model of the sources of variation. Then the slack of the overall circuit or chip is computed by combining these path slacks in a correlated probabilistic fashion. Unfortunately, there are an exponential number of paths in any circuit. It is not realistic to list and analyze all the paths in the circuit. Jess et al suggest that the top N critical paths be considered, but of course there is no guarantee that the $(N+1)^{st}$ path (or any path other than the first N paths) will not be critical at some point or corner in the process space or space of variations. All path-based methods have the fundamental limitation that the number of paths is too large and some heuristic must be used to limit the number of paths submitted for detailed analysis.

It is to be noted that although there are many significant sources of correlation in the delay variability of integrated circuits, there are some completely random sources of variation as well. For example, the oxide thickness in transistors in a modern technology is only a few atoms thick and for various reasons it is possible for transistors to have one more or one less layer of atoms, leading to variations that are quite random from transistor-to-transistor. While the prior-art method of Liou et al can handle such random variations, other prior-art methods such as those of Gattiker et al and Jess et al cannot.

Further, all of the above prior-art methods have other problems. An important output from a static timing program is diagnostics that can enable a designer, or automated synthesis or optimization program to improve the circuit. Here again, prior-art methods are lacking. For example, if a critical path has excessive sensitivity to a particular source of variation, then the circuit is not robust in the face of variations. If such diagnostics were available, the designer or synthesis program could take various measures to reduce the excessive sensitivity. So it is important for the output of a statistical timing program to be parameterized by the sources of variation. Instead of reporting that the arrival time at a node of the circuit has an unacceptably late probability distribution, it would be useful to report the sensitivity of the late arrival time to the various sources of variation in order to enable suitable remedies. Prior-art methods produce statistical timing results as probability distributions. Unfortunately, this does not help a human designer or automated optimization program in improving the performance or robustness of the circuit.

For these and other reasons, statistical timing methods that have been proposed in the literature are not used in industrial practice.

ASPECTS OF THE INVENTION

An aspect of this invention is an improved system and method for statistical or probabilistic static timing of a digital circuit.

Another aspect of this invention is a method for statistical timing that has linear complexity in the size of the timing graph, and linear complexity in the number of sources of variation.

Another aspect of this invention is a method for statistical timing that takes into account correlations between delays of individual gates and wires, and correlations between delays of paths of the circuit.

Another aspect of this invention is a method for statistical timing that allows delay models that contain a deterministic part, a correlated random part and an independent random part.

Another aspect of this invention is a timing result that expresses the arrival time, required arrival time, slew and slack of each node of the timing graph of the digital circuit as a probability distribution.

Another aspect of this invention is a timing result that expresses the arrival time, required arrival time, slew and slack of each node of the timing graph of the digital circuit in a form that is parameterized by the sources of variation.

SUMMARY OF THE INVENTION

The present invention is a system and method for statistical or probabilistic static timing analysis of digital circuits, taking into account statistical delay variations. The delay of each gate or wire is assumed to consist of a nominal portion, a correlated random portion that is parameterized by each of the sources of variation and an independent random portion. Arrival times and required arrival times are propagated as parameterized random variables while taking correlations into account. Both early mode and late mode timing are included; both combinational and sequential circuits are handled; static CMOS as well as dynamic logic families are accommodated. The timing analysis complexity is linear in the size of the graph and the number of sources of variation. The result is a timing report in which all timing quantities such as arrival times and slacks are reported as probability distributions in a parameterized form.

BRIEF DESCRIPTION OF THE FIGURES

The foregoing and other objects, aspects, and advantages will be better understood from the following non-limiting detailed description of preferred embodiments of the invention with reference to the drawings that include the following.

DETAILED DESCRIPTION OF THE INVENTION

Figure 1:
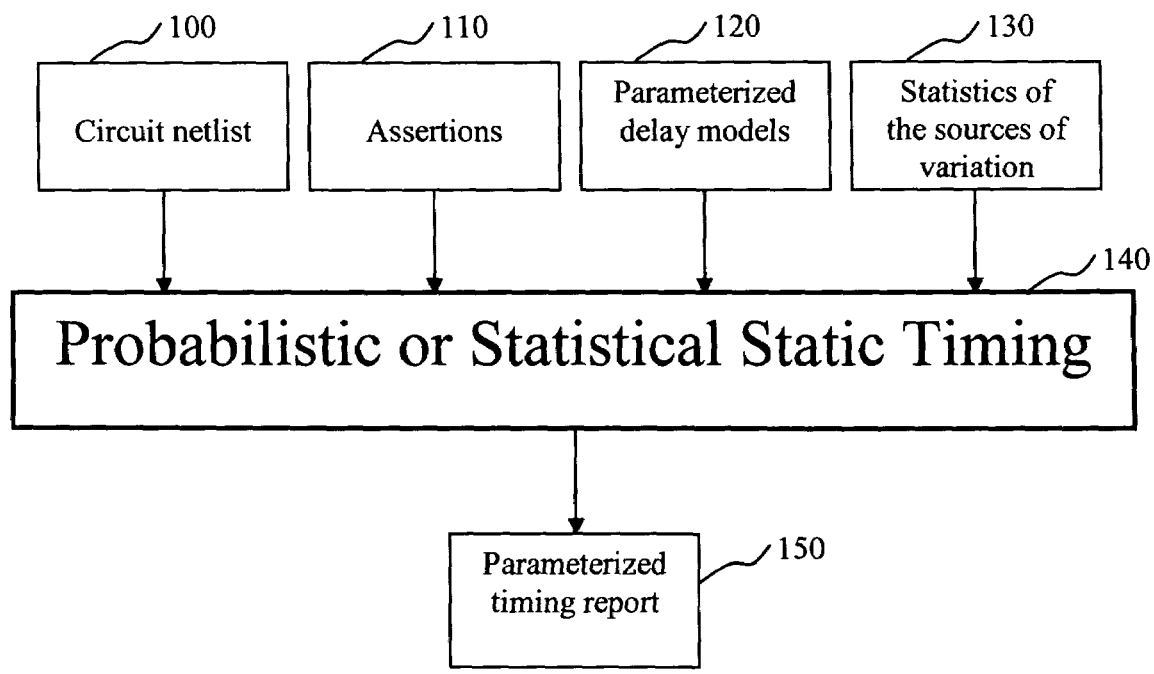
FIG. 1 is a block diagram of one preferred embodiment of the invention depicting statistical or probabilistic static timing of a digital circuit.

An inventive statistical or probabilistic static timing flow is shown in FIG. 1. The first input is the netlist representing the structure of the circuit to be analyzed, shown in box 100. The second input is a set of timing assertions, box 110. These typically include arrival times at the primary inputs, required arrival times at the primary outputs, information about the phases of the clock, and details of external loads that are driven by the primary outputs. The assertions can be in the form of deterministic numbers or independent probability distributions or correlated probability distributions. The third input is a set of parameterized delay models, box 120. These allow the timer to determine the delay of a gate or wire as a function not only of traditional delay-model variables (like input slew or rise/fall time, and output load) but also as a function of the sources of variation. For example, a first-order linear model may be employed, like the one shown below:

$$\text{delay} = a_0 + \sum_{i=1}^{n} a_i \Delta x_i + a_{n+1} \Delta R,$$

where the delay consists of a deterministic (constant) portion $a_0$, a correlated (or global) portion $$\sum_{i=1}^{n} a_i \Delta x_i$$

and an independent (or local) portion $a_{n+1} \Delta R$. The number of sources of variation is n, and $a_i$, i=1, Λ, n are the sensitivities of the delay to the sources of variation $x_i$, i=1, Λ, n and $a_{n+1}$ is the sensitivity to an independent random source of variation R. The notation $\Delta x_i$ denotes the deviation of $x_i$ from its mean or nominal value, and $\Delta R$ denotes the deviation of R from its mean or nominal value. It is to be understood that the delay models can be stored in a pre-characterization step or calculated on the fly as required. The format in which they are stored could include analytical delay equations or table models. The next input is information about the statistics of the sources of variation, box 130. This input typically has a list of the sources of variation with a mean value and standard deviation for each source of variation. Any correlations between the sources of variation are specified here.

Circuit netlists 100, assertions 110, parameterized delay models 120, statistics of the sources of variation 130, and their functional equivalents are well known in the prior art.

The novel probabilistic or statistical static timing program, box 140, accepts all of these inputs and produces a novel statistical timing report, box 150. This report typically includes arrival times, required arrival times, slacks and slews at each node of the circuit. These timing quantities are not single numbers, but rather they are probability distributions. The information in the timing report can take many forms, including one or more of: mean value and variance for each timing quantity, a parameterized representation of the distribution of each timing quantity, a graphical representation of the distribution of each timing quantity, and a correlation report between these various timing quantities. Various automatic audits such as checking for excessive sensitivities can be built into the timing report. The excessive sensitivities are of interest since they must be reduced in order to improve the robustness of the circuit. It is to be understood that the circuit being timed can be very large and can consist of millions of gates and wires. All the information mentioned above could be extremely voluminous, and so it is ordinary practice to provide options to selectively output the required information, or even calculate or graphically display all this information on-demand.

Figure 2:
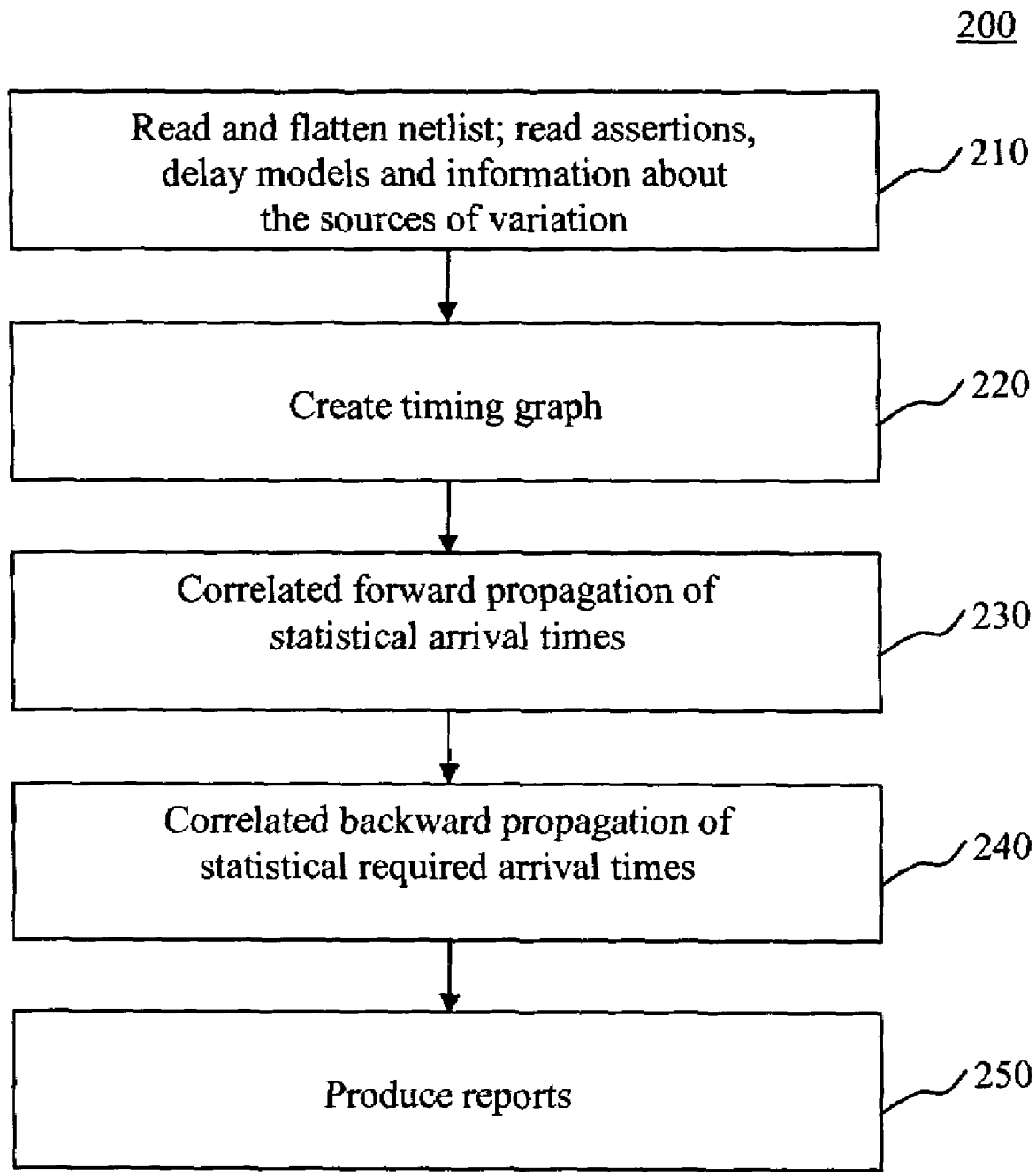
FIG. 2 is a flow chart of the preferred method of conducting statistical or probabilistic static timing of a digital circuit.

The details of the novel statistical timer of box 140 are shown in flow 200 of FIG. 2. The first step is to read the netlist that contains details of the topology of the circuit to be timed. Since this netlist is often in hierarchical form, it is flattened (i.e., the number of levels in the hierarchy is reduced). The assertions (each of which can be either deterministic or probabilistic) are read and so are the parameterized delay models. Information about the sources of variation such as the mean and standard deviation values and any correlation between the sources of variation are stored in memory in box 210.

The next major step, shown in box 220, is the construction of the timing graph, which is a step that is familiar in all static timing programs. In the graph, each node represents a node or signal of the circuit and each arc or edge represents a delay in the circuit incurred when a logical transition (from low to high or high to low) is transmitted through a circuit component such as a gate or wire. All possible valid logical transitions of the circuit are therefore captured in this graph. Arrival times are typically stored on the nodes of the graph and delays of individual gates and wires on the edges of the graph. An arrival time in late mode is the earliest time at which the corresponding signal is guaranteed to be stable at its correct logical value (having gone through any of the possible paths of the electrical circuit), and an arrival time in early mode is the earliest time at which the corresponding signal can change from its previous cycle stable logical value (i.e., the output can not change earlier than the early mode arrival time). Sequential elements and dynamic circuits in the graph are represented by a special kind of edge called a test segment, which is an indication to the timing program that a timing test must be performed between two nodes of the graph to ensure correct timing operation of the circuit. Building of such a graph for both gate-level netlists and transistor-level netlists is known in the prior art.

The next step is an inventive correlated statistical forward propagation of arrival times through the timing graph, box 230. Next, in box 240, an inventive correlated statistical backward propagation of required arrival times is performed. Finally, in box 250, inventive timing reports are produced. The details of the calculations involved in boxes 230 and 240 for both early mode and late mode analysis are explained in the following paragraphs.

Figure 3:
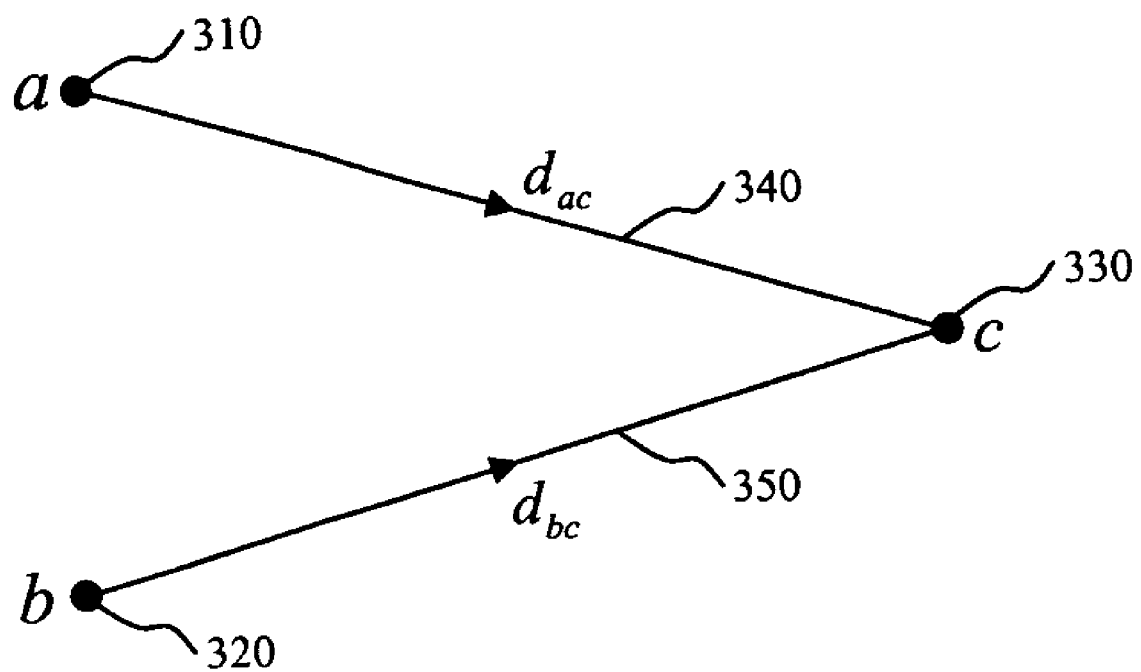
FIG. 3 shows two edges and three nodes of a timing graph to illustrate the basic forward propagation operations involved in statistical timing analysis.

The four basic operations in static timing analysis are "plus," "minus," "max" and "min." These four basic operations must be replaced by probabilistic equivalents for successful statistical timing analysis. It is crucial that the probabilistic equivalents must correctly consider and propagate correlations. Consider the simple situation shown in FIG. 3 where two directed edges of the timing graph (340 and 350) from nodes a (310) and b (320) meet at a common timing node c (330). The edge labeled $d_{ac}$ represents the delay from node a to node c, and $d_{bc}$ represents the delay from node b to node c. We assume that the early and late arrival times at a and b are known to be of the form $$AT_a^{late} = a_0^{late} + \sum_{i=1}^{n} a_i^{late} \Delta x_i + a_{n+1}^{late} \Delta R_a^{late},$$

$$AT_b^{late} = b_0^{late} + \sum_{i=1}^{n} b_i^{late} \Delta x_i + b_{n+1}^{late} \Delta R_b^{late},$$

$$AT_a^{early} = a_0^{early} + \sum_{i=1}^{n} a_i^{early} \Delta x_i + a_{n+1}^{early} \Delta R_a^{early}, \text{ and}$$

$$AT_b^{early} = b_0^{early} + \sum_{i=1}^{n} b_i^{early} \Delta x_i + b_{n+1}^{early} \Delta R_b^{early},$$

and the delays are known to be of the form $$d_{ac}^{late} = g_0^{late} + \sum_{i=1}^{n} g_i^{late} \Delta x_i + g_{n+1}^{late} \Delta R_g^{late},$$

$$d_{bc}^{late} = h_0^{late} + \sum_{i=1}^{n} h_i^{late} \Delta x_i + h_{n+1}^{late} \Delta R_h^{late},$$

$$d_{ac}^{early} = g_0^{early} + \sum_{i=1}^{n} g_i^{early} \Delta x_i + g_{n+1}^{early} \Delta R_g^{early}, \text{ and}$$

$$d_{bc}^{late} = h_0^{early} + \sum_{i=1}^{n} h_i^{early} \Delta x_i + h_{n+1}^{early} \Delta R_h^{early}.$$

At node c, it is required to determine $AT_c^{late} = \max[AT_a^{late} + d_{ac}^{late}, AT_b^{late} + d_{bc}^{late}]$ and $AT_c^{early} = \min[AT_a^{early} + d_{ac}^{early}, AT_b^{early} + d_{bc}^{early}]$, which are the earliest time at which c is guaranteed to be stable in the present clock cycle and the earliest time at which c can change from its previous cycle stable logical value, respectively. While the late mode calculations are illustrated below, the early mode calculations are performed in a similar fashion. Thus, $$AT_c^{late} = \max\left[\left\{a_0^{late} + \sum_{i=1}^{n} a_i^{late} \Delta x_i + a_{n+1}^{late} \Delta R_a^{late} + g_0^{late} + \sum_{i=1}^{n} g_i^{late} \Delta x_i + g_{n+1}^{late} \Delta R_g^{late}\right\},\right.$$

$$\left\{b_0^{late} + \sum_{i=1}^{n} b_i^{late} \Delta x_i + b_{n+1}^{late} \Delta R_b^{late} + h_0^{late} + \sum_{i=1}^{n} h_i^{late} \Delta x_i + h_{n+1}^{late} \Delta R_h^{late}\right\}\right] =$$

$$\max\left[\left\{(a_0^{late} + g_0^{late}) + \sum_{i=1}^{n} (a_i^{late} + g_i^{late}) \Delta x_i + a_{n+1}^{late} \Delta R_a^{late} + g_{n+1}^{late} \Delta R_g^{late}\right\},\right.$$

$$\left\{(b_0^{late} + h_0^{late}) + \sum_{i=1}^{n} (b_i^{late} + h_i^{late}) \Delta x_i + b_{n+1}^{late} \Delta R_b^{late} + h_{n+1}^{late} \Delta R_h^{late}\right\}\right].$$

If the sources of variation (the global x and the local R variables) are Gaussian or normal distributions, the two quantities above whose maximum we seek to find are also Gaussian. Hence we can write $$AT_c^{late} = \max[\{p_1 = N(\mu_1, \sigma_1)\}, \{p_2 = N(\mu_2, \sigma_2)\}],$$

where $p_1$ and $p_2$ are Gaussian random variables with means and variances assumed to be as shown above. These two random variables are not independent, i.e., the two random variables are correlated. However, the sources of variation, x, may be correlated or independent. Each of these cases is described below.

Assuming that the sources of variation are independent of each other and of zero mean and unit variance, we can write down the covariance matrix as $$cov(p_1, p_2) =$$

$$\begin{bmatrix} \sum_{i=1}^{n} \{a_i^{late} + g_i^{late}\}^2 + \{a_{n+1}^{late}\}^2 + \{g_{n+1}^{late}\}^2 & \sum_{i=1}^{n} (a_i^{late} + g_i^{late}) + (b_i^{late} + h_i^{late}) \\ \sum_{i=1}^{n} (a_i^{late} + g_i^{late})(b_i^{late} + h_i^{late}) & \sum_{i=1}^{n} \{b_i^{late} + h_i^{late}\}^2 + \{b_{n+1}^{late}\}^2 + \{h_{n+1}^{late}\}^2 \end{bmatrix},$$

but if the sources of variation are not independent, the covariance matrix is $$\begin{bmatrix} (a_1 + g_1) & (a_2 + g_2) & \Lambda & (a_n + g_n) & a_{n+1} & g_{n+1} & 0 & 0 \\ (b_1 + h_1) & (b_2 + h_2) & \Lambda & (b_n + h_n) & 0 & 0 & b_{n+1} & h_{n+1} \end{bmatrix}[V]$$

-continued $$\begin{bmatrix} (a_1+g_1) & (b_1+h_1) \\ (a_2+g_2) & (b_2+h_2) \\ M & M \\ (a_n+g_n) & (b_n+h_n) \\ a_{n+1} & 0 \\ g_{n+1} & 0 \\ 0 & b_{n+1} \\ 0 & h_{n+1} \end{bmatrix},$$

where V is the covariance of the sources of variation supplied by the user and the superscript late has been omitted in the latter equation for brevity. (Note that in the independent case above, V was a diagonal matrix.) In either case, comparing to $$cov(p_1, p_2) = \begin{bmatrix} \sigma_1^2 & \sigma_1\sigma_2\rho \\ \sigma_1\sigma_2\rho & \sigma_2^2 \end{bmatrix},$$

$\sigma_1$, $\sigma_2$ and the correlation coefficient $\rho$ can be deduced. In the case when the sources of variation are independent, this can be achieved by collecting the sum of the squares and products of the corresponding coefficients of the two Gaussians whose maximum we seek to determine. It is to be noted that the random components of arrival time and delay contribute to the diagonal terms of the 2×2 covariance matrix thus increasing the variance of the two quantities whose maximum is being determined, but do not contribute to the off-diagonal terms, thereby reducing the correlation coefficient.

The next step is to compute $\max[p_1,p_2]$, which can be done by prior art methods as taught in [J. A. G. Jess and C. Visweswariah, "System and Method For Statistical Modeling And Statistical Timing Analysis Of Integrated Circuits," U.S. patent application Ser. No. 0/184,329 filed with the U.S. Patent Office on Jun. 27, 2002] and Jess et al [J. A. G. Jess, K. Kalafala, S. R. Naidu, R. H. J. M. Otten and C. Visweswariah, "Statistical timing for parametric yield prediction of digital integrated circuits," Proc. Design Automation Conference, June 2003, Anaheim, Calif., pages 932-937]. The references cited above are herein incorporated by reference in their entirety. Briefly, the preferred way this is performed is to sweep a variable $\eta$ through a suitable range of values (for example, from $\max(\mu_1-3\sigma_1,\mu_2-3\sigma_2)$ to $\max(\mu_1+3\sigma_1,\mu_2+3\sigma_2)$). At each value of $\eta$, the probability of $p_1=\eta$ is multiplied with the conditional probability of $p_2<\eta$ to obtain the probability that $p_1$ dominates $p_2$. Likewise, at that same value of $\eta$, the probability of $p_2=\eta$ is multiplied with the conditional probability of $p_1<\eta$ to obtain the probability that $p_2$ dominates $p_1$. This exercise results in the probability distribution of $AT_c^{late}$. The individual probabilities of $p_1$ dominating $p_2$ and $p_2$ dominating $p_1$ are collected over all values of $\eta$; these are called "binding probabilities" in the references cited above, whereas in this document they are called "arrival tightness probabilities" (ATP) since these are the probabilities that the arrival time at c is determined by the upper and lower edges of FIG. 3, respectively. Let us denote these arrival tightness probabilities as T and (1−T), respectively. It is to be noted that the method in Jess et al uses a similar technique, but does not consider a purely random component of the delay, and also applies the method on a path basis, whereas here it is being applied at each node of the timing graph.

The last step before moving further along in the timing graph is to re-express the late arrival time at c in a form that allows it to be propagated downstream in the timing graph. The way it is re-expressed is as follows. Since the arrival time at c is determined by the upper edge of FIG. 3 T % of the time, the dependence of the arrival time at c on the global sources of variation are derived from the upper edge, but with a weight factor of T. Likewise, the dependence of the arrival time at c on the global sources of variation is derived from the lower edge, but with a weight factor of (1−T). Expressed mathematically, $$AT_c^{late} = c_0^{late} + \sum_{i=1}^{n} c_i^{late}\Delta x_i + c_{n+1}^{late}\Delta R_c^{late}$$

$$c_i^{late} = T(a_i^{late} + g_i^{late}) + (1-T)(b_i^{late} + h_i^{late}), i = 1, 2, \Lambda n.$$

All that remains is to determine $c_0^{late}$ and $$c_{n+1}^{late},$$

which are easily done from the probability distribution of $AT_c^{late}$. The mean of the distribution is assigned to $c_0^{late}$, and the random portion $$c_{n+1}^{late}$$

is assigned a value such that the variance of the distribution matches the variance of the re-expressed arrival time.

Now that the arrival time at c has been expressed in the "standard form," it can be propagated downstream. It is to be understood that early mode calculations simply require computation of the minimum of two distributions instead of the maximum. The conditional probabilities are computed in a slightly different way and the rest of the procedure is identical. For example, during the sweeping of $\eta$, the probability of $p_1=\eta$ is multiplied by the conditional probability of $p_2>\eta$ to obtain the probability that $p_1$ is smaller than $p_2$. It is to be understood that one of ordinary skill in the art can extend the above methods to accommodate various functional forms of the delay equations and various types of probability distributions. All that is required is to compute the tightness probabilities T and (1−T), and to re-express the arrival time at c in the "standard form" for downstream propagation.

When more than two edges converge at a timing node, the maximization or minimization is done two edges at a time. The arrival tightness probabilities are stored as the computation unfolds, and then the final tightness probabilities are assigned in a post-processing step. For example, suppose there are 3 edges that converge at a timing point. Suppose the tightness probabilities of the first two are determined to be 60% and 40%, respectively. Now the maximum of these two distributions is in turn max'ed with the path delay represented by the $3^{rd}$ edge. Suppose the tightness probabilities that results from this computation are 80% for the first pair of edges, and 20% for the $3^{rd}$ edge. Then the final arrival tightness probabilities for the 3 edges are respectively 48% (0.6× 0.8), 32% (0.4×0.8) and 20%.

It is to be understood that early mode arrival times are propagated forward through the timing graph in an analogous manner, the only difference being that early mode delays are considered and the "min" operation is used instead of the "max" operation.

In this manner, both early and late arrival times are propagated forward through the levelized timing graph until the arrival times of all end points have been computed. End points are either primary outputs or test segments. At primary outputs, the probabilistic arrival time is subtracted from the asserted required arrival time in late mode, and vice versa in early mode, to determine the late and early slack of the primary output, respectively. A zero slack means that the timing requirement was exactly meant. A positive slack means that there is some timing margin over and above meeting requirements. A negative slack means that the circuit will not perform correctly.

Similarly, arrival times are compared to each other at test segments to determine a slack. For example, at a latch, the late data arrival time is typically added to a setup (or guard) time of the latch and then compared to the early clock arrival time to make sure data is correctly latched. For different types of latches and different types of dynamic circuits, these comparisons will take different forms, but they are all straightforward extensions of the same concept.

After the forward propagation is complete, the next step is correlated statistical backward propagation of required arrival times (box 240 of FIG. 2). Starting at each end point, required arrival times are propagated backwards in a levelized fashion, as in traditional static timing analysis. However, in the inventive method, these required arrival times are statistical in nature. The operations involved in box 240 of FIG. 2 are conducted similarly to box 230 of FIG. 2, but with a few important differences. The first is that during backward traversal, delays are subtracted from required arrival times rather than being added to arrival times. The second difference is that during backward traversal, late mode analysis calls for the "min" operation whereas early mode analysis calls for the "max" operation. The third difference is that the required arrival tightness probability of an edge of the timing graph is defined as the probability that the required arrival time of the source node of the edge is determined by that edge. These tightness probabilities are determined in much the same way as arrival tightness probabilities during the forward propagation of box 220, and applied in much the same way to express required arrival times in the standard manner before propagating further. Thus the backward propagation is conducted quite similarly to the forward propagation, but with these few important differences.

Figure 4:
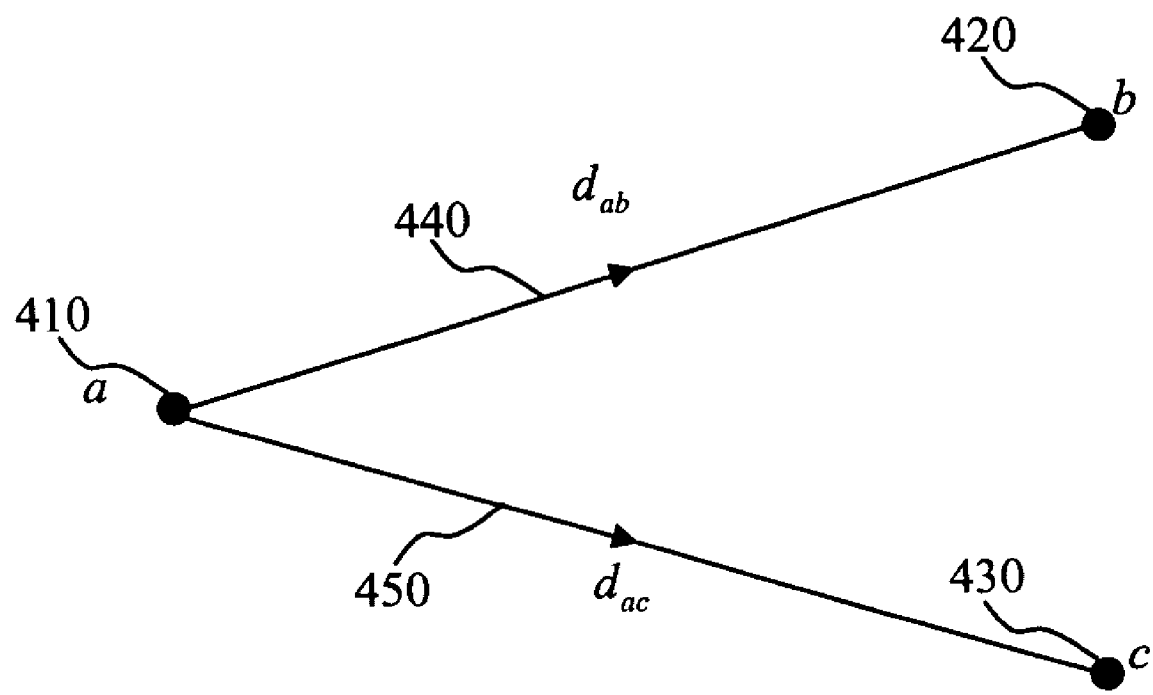
FIG. 4 shows two edges and three nodes of a timing graph to illustrate the basic backward propagation operations involved in statistical timing analysis.

Backward propagation is illustrated in reference to FIG. 4. The basic goal of backward propagation is to determine the required arrival time of every node of the timing graph. Suppose we are trying to compute the required arrival time at node a (box 410) of FIG. 4, which has two fanout edges (box 440 and box 450) to nodes b (box 420) and c (box 430), respectively. Then the required arrival time at node a in late mode can be written as $$RAT_a^{late} = \min[\{RAT_b^{late} - d_{ab}^{late}\}, \{RAT_c^{late} - d_{ac}^{late}\}]$$

and the required arrival time at node a in early mode can be written as $$RAT_a^{early} = \max[\{RAT_b^{early} - d_{ab}^{early}\}, \{RAT_c^{early} - d_{ac}^{early}\}].$$

The actual process of subtracting the delay of the edge and then taking the max or min is similar to the operations performed during forward propagation. Likewise, required arrival tightness probabilities are determined in an exactly analogous manner to the corresponding calculations during forward propagation.

Once the forward and backward propagation are complete, the late and early arrival times, required arrival times and slacks are now available everywhere in the timing graph, and these can be reported to the user in many different forms (box 250 of FIG. 2). These can include graphical plots, textual tables, queries on-demand, audits of failing timing tests, audits of excessive sensitivity at all timing points or all end points, and so on.

Figure 5:
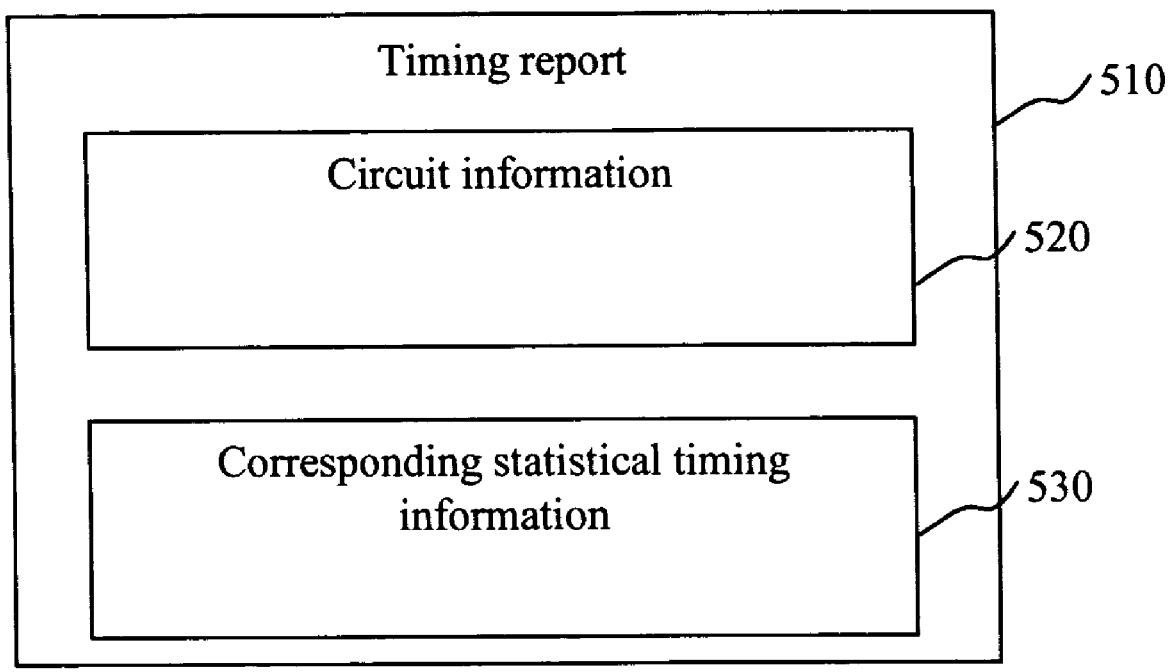
FIG. 5 is a block diagram of one preferred embodiment of an output report.

Timing reports are illustrated in box 510 FIG. 5. Timing reports are communicated to the user either by means of a programming interface, or by means of a hard disk file or files. A timing report typically consists of some circuit information (box 520) and the corresponding statistical timing information (box 530). Circuit information can include a list of gates, components and wires; or a list of paths; or a list of nodes; or a list of sequential elements; or a list of end points (primary outputs and timing tests); or a list of clock phases. These items can be sorted and filtered in various ways to make the report intuitive and productive to the reader of the report. The corresponding statistical timing information, in the case of a node, could include one or more of the node's statistical arrival time, statistical required arrival time, statistical slew or statistical slack. For a timing test or primary output, the corresponding timing information could include the probability that the timing test is met, or the primary output meets its required arrival time, respectively. For a path, the corresponding timing information could include the statistical path slack and statistical arrival time, required arrival time, slew and slack of its end point. Further, each statistical timing quantity in the report can be represented in various forms, including a mean value and standard deviation; a mean value, independent random part and a correlated part; a graphical display of the distribution of the timing quantity; or sensitivities to individual global sources of variation. Further, given any two statistical timing quantities, the report could include the correlation coefficient of the two quantities, the covariance matrix of the two quantities, and the probability that one is larger or smaller than the other. It is to be understood that each of the timing quantities in the above description can be one of an early-mode or late-mode timing quantity; one of a rising or falling timing quantity; and a timing quantity that is specific to a particular phase of a particular clock. It is to be further understood that once the statistical timing analysis is completed, these results can be reported in a variety of useful ways.

It is to be understood that the detailed description of this invention was explained in the context of a simple snippet of a timing graph. One of ordinary skill in the art will be able to extend these concepts to accommodate separate rising and falling arrival times and delays; sequential circuits; circuits with transparent latches; extensions to handle slew (rise/fall time) propagation and effects; probabilistic delay models that are purely random; probabilistic delay models that are correlated; sources of variation that are random; sources of variation that are correlated; circuits with probabilistic guard times on the latch setup and hold tests; circuits with probabilistic guard times on dynamic circuit timing tests; circuits with multiple clock phases; cases in which clock cycle periods and timing assertions are probabilistic; transistor level netlists, and situations where the parameterized delay models are calculated on the fly by circuit simulators.

Given this disclosure it is apparent to one skilled in the art that the inputs received by the probabilistic or statistical static timing process (box 140 of FIG. 1) can be any input generally known to computer systems, including but not limited to: keyboard or mouse entries, disk, tape, CD-ROM, network connection, fiber optic connection, radio frequency link, infra red link, etc. Further the outputs including the parameterized timing report (box 150 of FIG. 1) can take the form of any known computer output. These outputs include but are not limited to: printed output from a printer, images on a graphical user interface (GUI) or CRT, content on storage media (e.g., memory, CD-ROM, disk, diskette), files, information transmitted over a network (fiber optic, telephone, cable, radio frequency, infrared, etc.).

I claim:

1. A system for determining timing in an electrical circuit comprising:
   a. a netlist input for receiving a circuit netlist representing a topology of the electrical circuit to be timed;
   b. an assertion input for receiving a set of one or more assertions representing boundary timing conditions;
   c. a delay variability input for receiving a list of one or more sources of delay variation that contain variability information of one or more of the sources of variation;
   d. a model input for receiving parameterized delay models, each parameterized delay model containing one or more models for a delay of one or more components of the electrical circuit, each model being a function of one or more of the sources of delay variation; and
   e. a process that determines and outputs a statistical arrival time of one or more nodes of the electrical circuit, the statistical arrival time being in a form of a weighted sum of probability distributions of one or more of the sources of variation.

2. A system, as in claim 1, where the process determines the statistical arrival times by visiting each node of the electrical circuit only once.

3. A system, as in claim 1, where the system further determines and outputs a statistical required arrival time of one or more nodes of the electrical circuit, the statistical required arrival time being in a form of a weighted sum of probability distributions of one or more of the sources of variation.

4. A system, as in claim 1, where the process further determines and outputs a statistical slack of one or more nodes of the electrical circuits, the statistical slack being in a form of a weighted sum of probability distributions of one or more of the sources of variation.

5. A system, as in claim 1, where the process determines and outputs a statistical slew of one or more nodes of the electrical circuits, the statistical slew being in the form of a weighted sum of probability distributions of one or more of the sources of variation.

6. A system, as in claim 1, where the process further performs a late mode statistical timing analysis and outputs late mode arrival times.

7. A system, as in claim 1, where the process further performs an early mode statistical timing analysis and outputs one or more early mode arrival times.

8. A system, as in claim 1, where one or more separate rising and falling statistical delays are provided for each component of the electrical circuit and the process further determines and outputs one or more separate rising and falling statistical arrival times for one or more nodes of the electrical circuit.

9. A system, as in claim 8, where the process further determines and outputs one or more of the separate rising and falling statistical required arrival times, one or more separate rising and falling statistical slacks, and one or more separate rising and falling statistical slews for one or more nodes of the electrical circuit.

10. A system, as in claim 1, where the electrical circuit is one or more of the following: a combinational circuit, a sequential circuit, a static logic circuit, and a dynamic logic circuit.

11. A system, as in claim 1, where the electrical circuit is a sequential circuit that contains one or more of the following: an edge-triggered latch, a master-slave latch, a level-sensitive latch, and a transparent latch.

12. A system, as in claim 1, where the circuit contains multiple clock phases.

13. A system, as in claim 1, where the parameterized delay model for each component of the electrical circuit comprises one or more of: a deterministic part, a correlated part, and an independently random part.

14. A system, as in claim 13, where the sources of variation are correlated.

15. A system, as in claim 13, where the sources of variation are independent.

16. A system, as in claim 1, where the parameterized delay models are pre-stored in a table in one or more memories of the system.

17. A system, as in claim 1, where the parameterized delay models are pre-stored as coefficients of delay equations in one or more memories of the system.

18. A system, as in claim 1, where the parameterized delay models are determined by circuit simulation on-the-fly.

19. A system, as in claim 1, where each assertion is one of deterministic and statistical.

20. A system for analyzing timing of an electrical circuit, comprising:
    a. means for reading the netlist, assertions, parameterized delay models and list of sources of variation;
    b. means for building a timing graph that represents the electrical circuit, the timing graph having one or more nodes and one or more edges;
    c. means for levelizing the graph for forward propagation of statistical arrival times; and
    d. at each level of the timing graph, means for propagating one or more statistical arrival times at each of the nodes, each of the statistical arrival times being a weighted sum of probability distributions of one or more of the sources of variation.

21. A system, as in claim 20, further comprising:
    e. means for levelizing the graph for backward propagation of statistical required arrival times; and
    d. at each level of the timing graph, means for propagating one or more statistical required arrival times at each of the nodes, each of the statistical required arrival times being a weighted sum of probability distributions of one or more of the sources of variation.

* * * * *